(12) United States Patent
Shiau

(10) Patent No.: US 6,604,281 B2
(45) Date of Patent: Aug. 12, 2003

(54) CIRCUIT BOARD PACKAGING PROCESS FOR PREVENTING ELECTROMAGNETIC INTERFERENCE

(75) Inventor: Dennis Shiau, Taichung Hsien (TW)

(73) Assignee: Power Mate Technology Co., Ltd. (TW)

( * ) Notice: Subject to any disclaimer, the term of this patent is extended or adjusted under 35 U.S.C. 154(b) by 91 days.

(21) Appl. No.: 09/901,653

(22) Filed: Jul. 11, 2001

(65) Prior Publication Data

US 2003/0009877 A1 Jan. 16, 2003

(51) Int. Cl.[7] .................................................. H05K 3/34
(52) U.S. Cl. .......................... 29/840; 29/827; 29/841; 29/848; 29/878; 264/245; 264/272.15; 264/272.17
(58) Field of Search .......................... 29/825, 827, 830, 29/832, 837, 839, 840, 841, 842, 843, 848, 828; 264/250, 254, 272.15, 272.17

(56) References Cited

U.S. PATENT DOCUMENTS 5,318,855 A * 6/1994 Glovatsky et al. .......... 428/457
5,461,545 A * 10/1995 Leroy et al. ................ 361/765

* cited by examiner

Primary Examiner—Peter Vo
Assistant Examiner—Donghai D Nguyen
(74) Attorney, Agent, or Firm—Browdy and Neimark, P.L.L.C.

(57) ABSTRACT

A packaging process of a circuit board involves a first step in which the circuit board is provided with a predetermined number of pins and is then arranged in the lower mold of a first molding tool. The upper mold of the first molding tool is joined with the lower mold before the resin is injected. The mold is then opened to remove therefrom a semifinished product, which is provided with a metal passivation layer and is subsequently placed in a second molding tool to carry out a second packaging operation. The second molding tool is opened to remove therefrom a finished product.

5 Claims, 6 Drawing Sheets

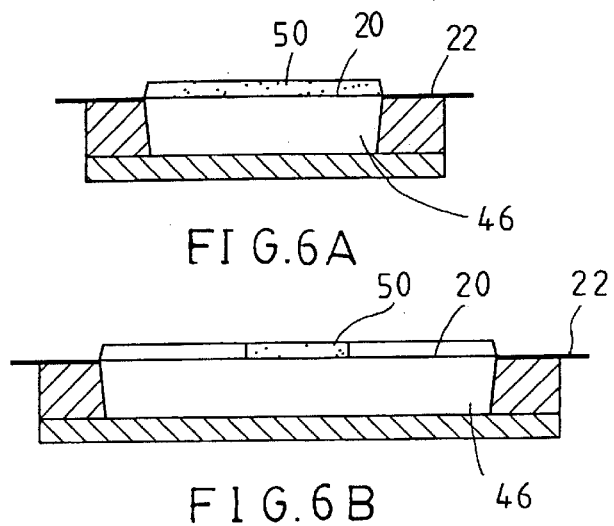
FIG. 6A
FIG. 6B
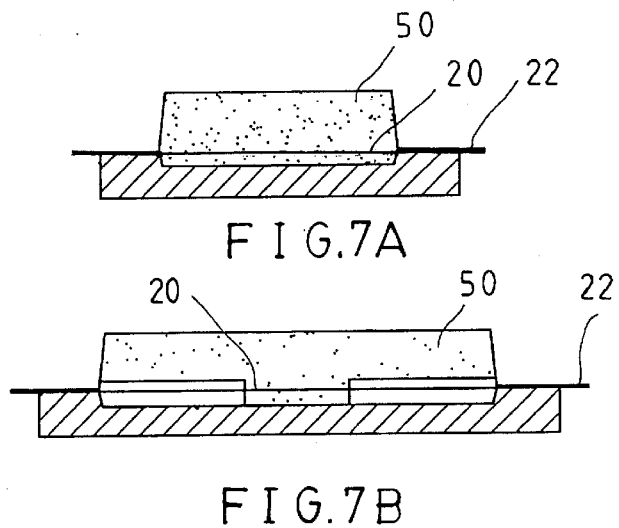
FIG. 7A
FIG. 7B
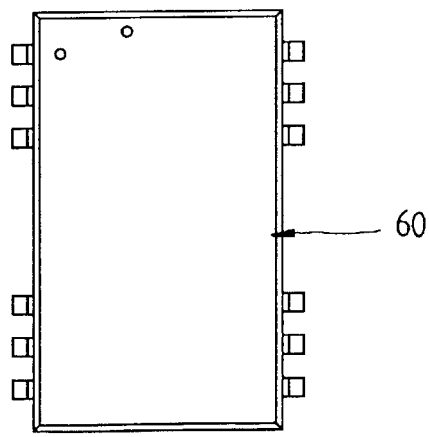
FIG. 8

CIRCUIT BOARD PACKAGING PROCESS FOR PREVENTING ELECTROMAGNETIC INTERFERENCE

FIELD OF THE INVENTION

The present invention relates generally to a circuit board packaging process, and more particularly to a circuit board packaging process for obstructing the electromagnetic interference.

BACKGROUND OF THE INVENTION

The conventional process for packaging a circuit board involves a first step in which the circuit board with electronic parts being mounted thereon is placed on a die casting machine. As the upper mold and the lower mold are closed, the molten resin is forced into the mold. Upon completion of the hardening of resin, the finished product is removed from the mold.

The above packaging process is carried out in such a manner that the circuit carries out the signal transmission via the resin layer. Under such a circumstance, it is devoid of the protection of the metal layer. As a result, the system operation is susceptible to electromagnetic interference, thereby resulting in the signal instability. In order to provide a remedy, the circuit board is manually packaged in a metal shell 12, and then an insulation substrate 14 is sputtered, as shown in FIG. 1. This technique involves the use of an inert gas, such as argon ion, which is accelerated in the vacuum to smash the target. As a result of the smash sputtering, the surface of the substrate 14 is provided with a passivation film 16 to prevent the electromagnetic interference. Alternatively, the inner side of the substrate 14 is provided with a copper piece 18 to prevent the electromagnetic interference, as shown in FIG. 2.

The passivation film or the copper piece is provided after the packaging process is completed. In light of the passivation film or the copper piece not being formed integrally, it is apt to deviate to impair the prevention of the electromagnetic interference. In addition, the manual operation is time-consuming. The copper piece is joined with the substrate by drilling or bending, thereby resulting in an increase in production cost.

SUMMARY OF THE INVENTION

The primary objective of the present invention is to provide a circuit board packaging process for enhancing the efficiency of preventing the electromagnetic interference.

It is another objective of the present invention to provide a cost-effective process for packaging a circuit board to prevent the electromagnetic interference.

The process of the present invention involves a first step in which a circuit board is welded with a predetermined number of pins and is then arranged in the lower mold of a first molding tool. The upper mold of the first molding tool is joined with the lower mold before the resin is injected. The mold is then opened to remove therefrom a semifinished product, which is then provided with a metal passivation layer and is subsequently placed in a second molding tool to carry out another packaging operation. The second molding tool is finally opened to remove therefrom a finished product.

BRIEF DESCRIPTION OF THE DRAWINGS

FIG. 6(a) shows a horizontal schematic view of the upper portion of the semifinished product of the present invention being sputtered.

FIG. 6(b) shows a longitudinal schematic view of the upper portion of the semifinished product of the present invention being sputtered.

FIG. 7(a) shows a horizontal schematic view of the lower portion of the semifinished product of the present invention being sputtered.

FIG. 7(b) shows a longitudinal schematic view of the lower portion of the semifinished product of the present invention being sputtered.

FIG. 8 shows a schematic view of the finished product of the present invention.

DETAILED DESCRIPTION OF THE INVENTION

Figure 1:
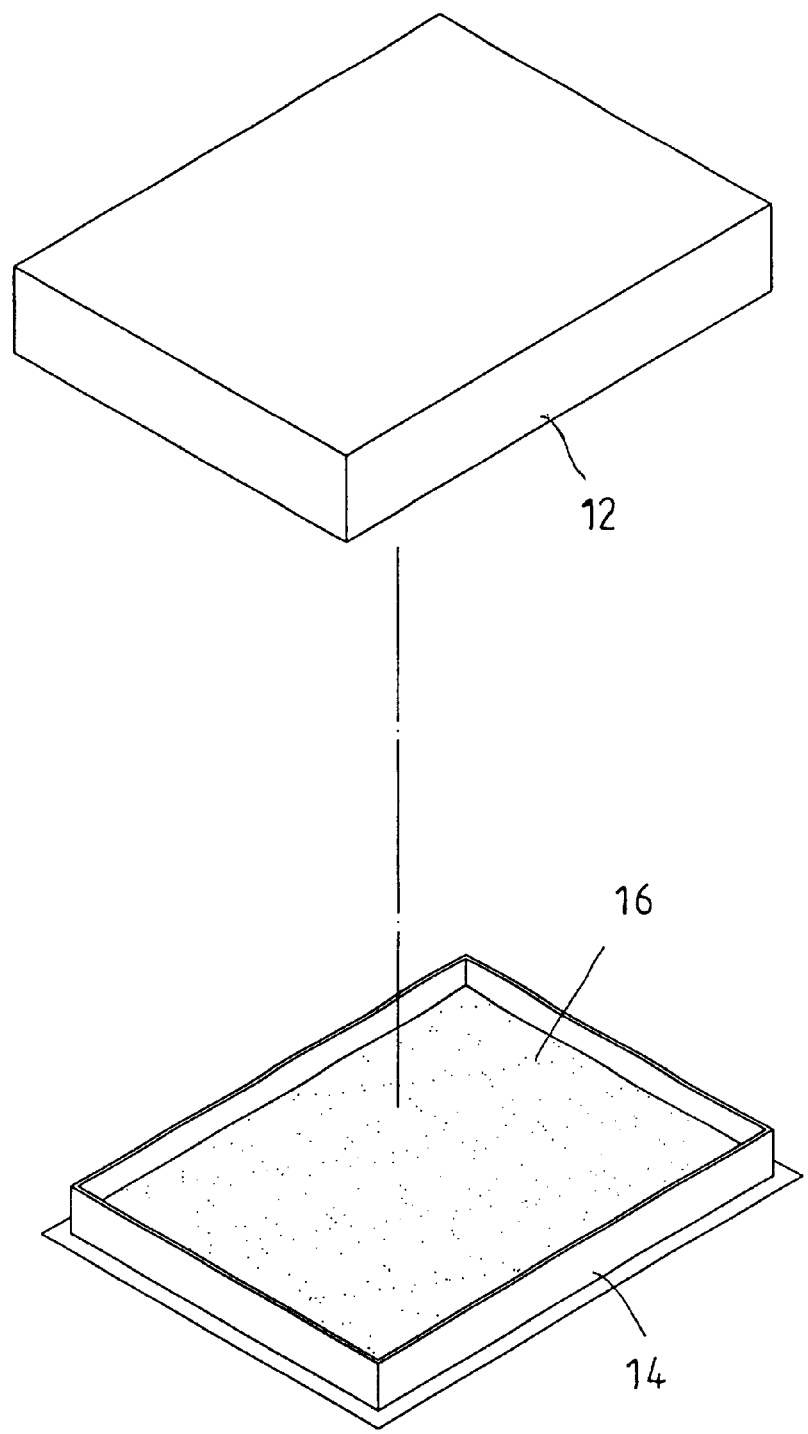
FIG. 1 shows a schematic view of the inner side surface of the conventional substrate being sputtered.
Figure 2:
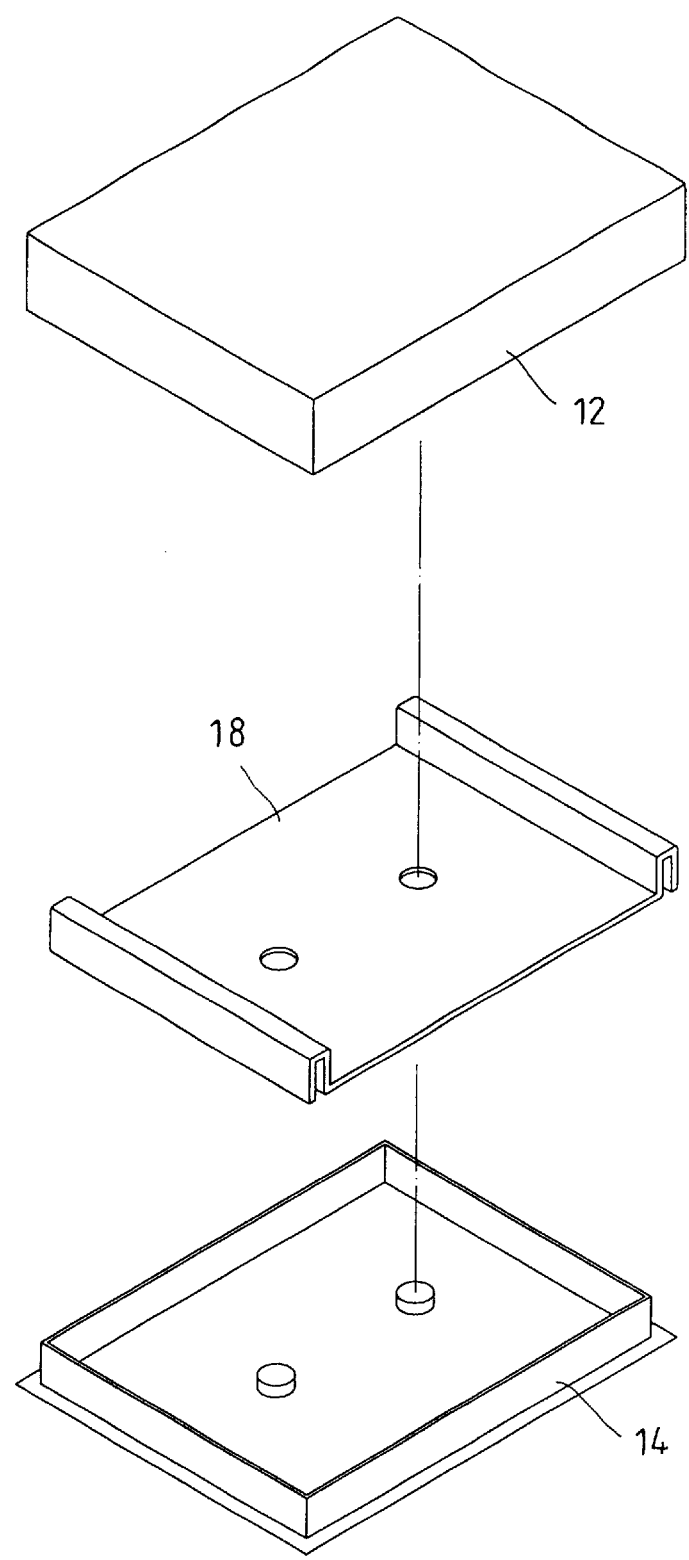
FIG. 2 shows a schematic view of the inner side of the conventional substrate being provided with a copper piece.
Figure 3:
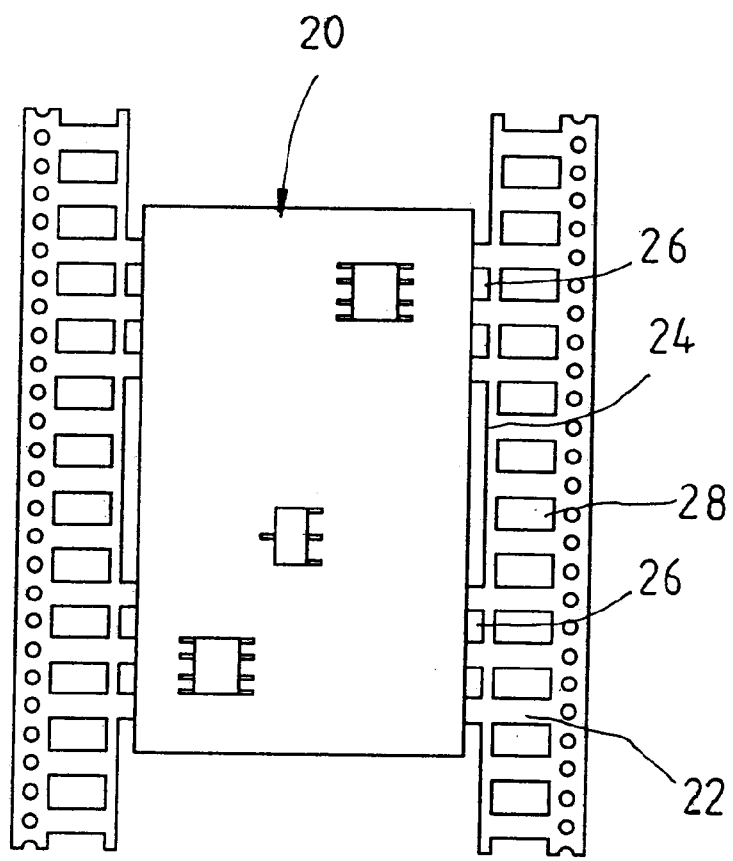
FIG. 3 shows a schematic plan view of a semifinished product of the present invention comprising a circuit board and the pins welded to the circuit board.
Figure 9:
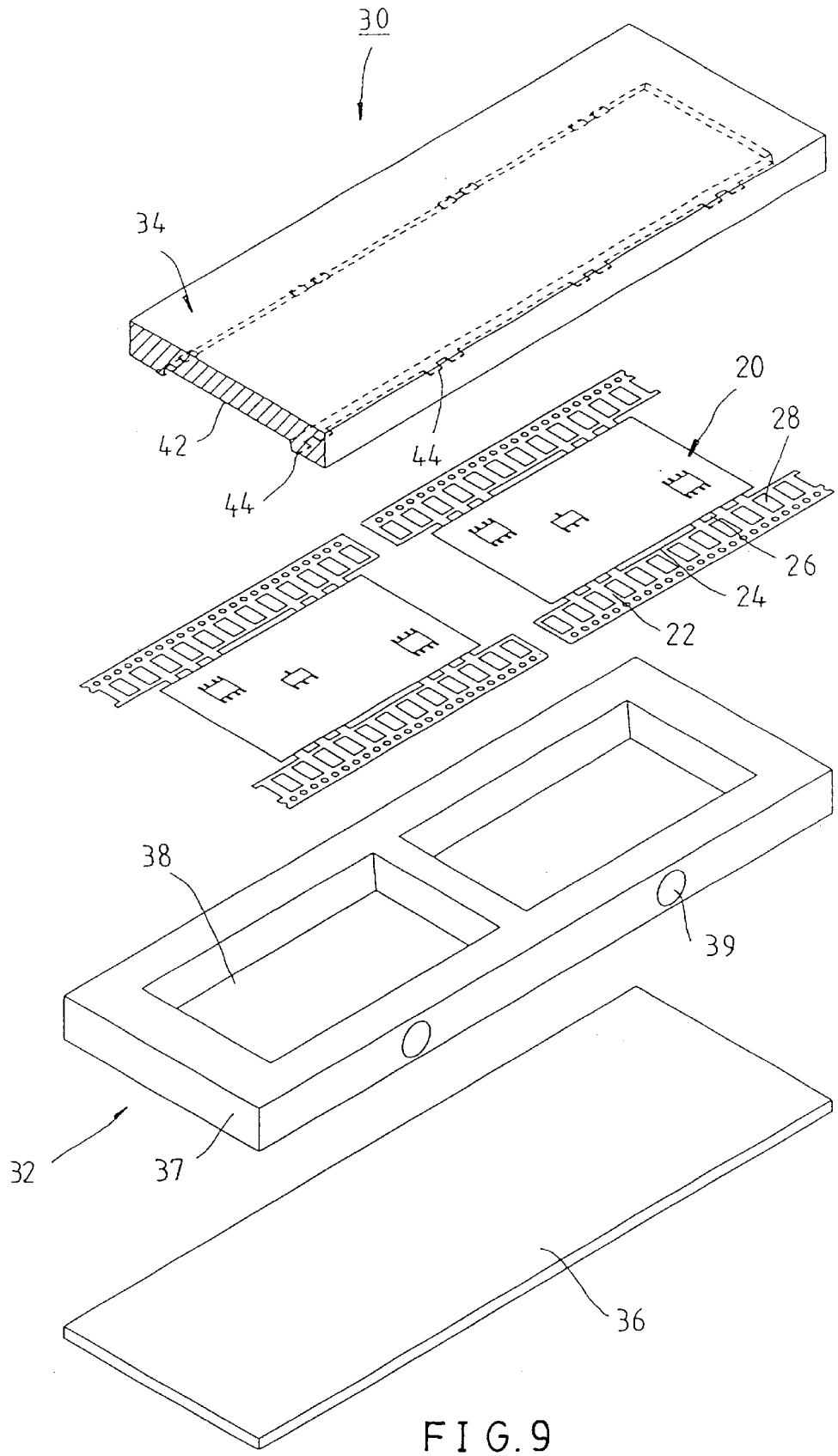
FIG. 9 is a view similar to that of FIG. 4 showing two circuit boards.

As shown in FIGS. 3 and 9, two circuit boards 20 are packaged at the same time in the present invention. Each circuit board 20 is provided with a predetermined number of pins 22 welded thereto. The pin 22 is provided at the front end and two sides thereof with an indentation 28 for retaining the resin on the circuit board 20. Located at a distance from the front end of each pin 22 is a connection piece 24 connected serially with pins, thereby enabling pins 22 to locate with precision and to be less vulnerable to severance. When the pins 22 are welded to the circuit board 20, a plurality of grid cells 26 are formed between each pin 22 and the connection piece 24.

Figure 5:
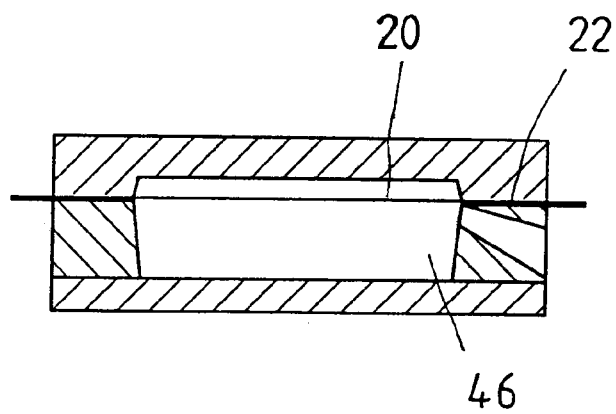
FIG. 5 shows a schematic view of the semifinished product of the circuit board of the present invention after the first packaging process.
Figure 4:
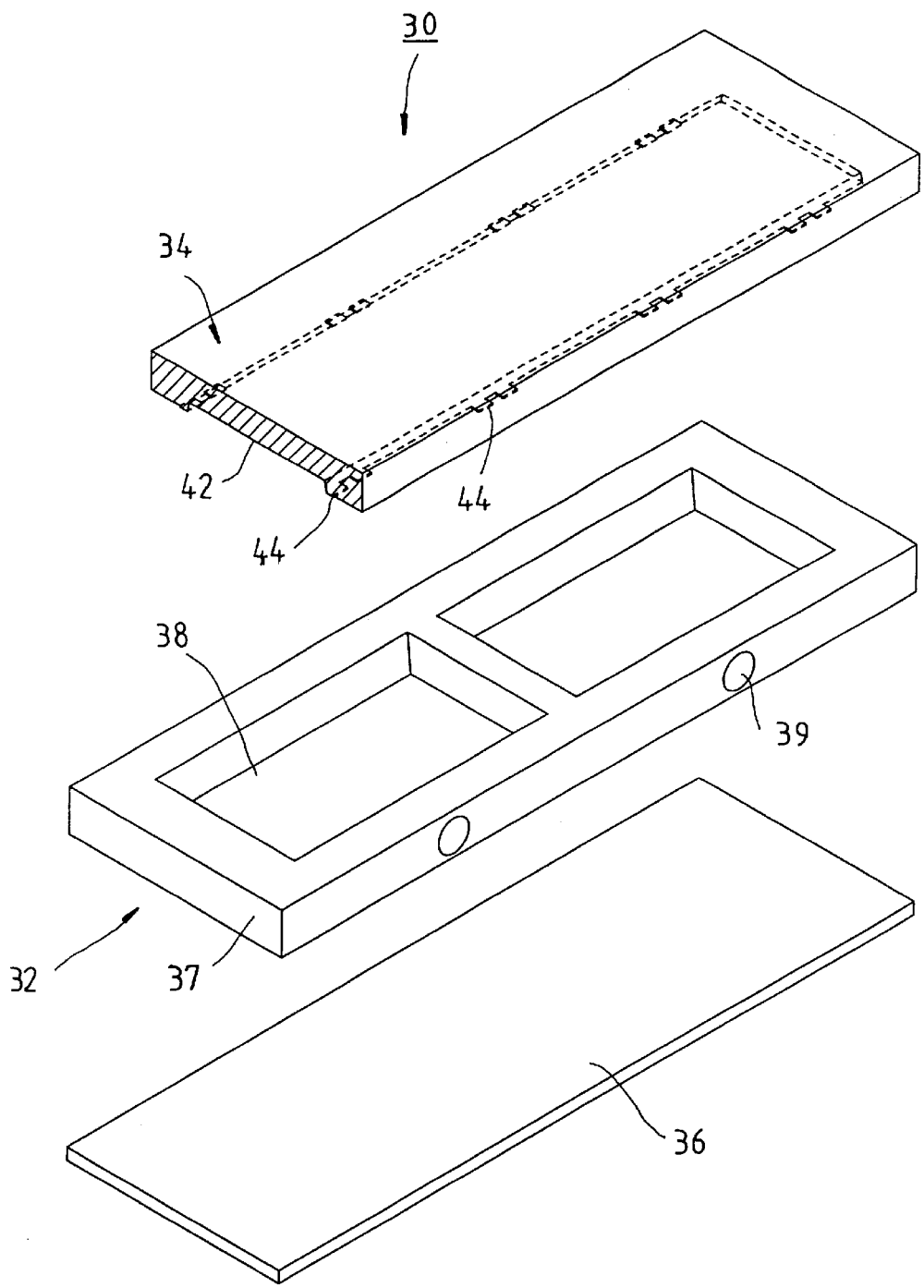
FIG. 4 shows an exploded view of the first molding tool of the present invention.

A first step of the present invention involves the arrangement of two circuit boards 20 in the lower mold 32 of a first molding tool 30. The upper mold 34 of the first molding tool 30 is then joined with the lower mold 32, as shown in FIG. 4. The lower mold 32 comprises a flat board 36 which is provided with a grid fence 37 forming two receiving slots 38. The slots 38 are provided with an inlet 39 respectively. The upper mold 34 is provided with two cavities 42 opposite to the receiving slots 38. The cavities 42 are provided with a plurality of protruded blocks 44 opposite to the grid cells 26. When the upper mold 34 and the lower mold 32 are joined together, as shown in FIG. 5, the protruded blocks 44 of the upper mold 34 are extended into the grid cells 26. In the meantime, the resin 46 is injected via the inlets 39 such that the resin 46 covers the circuit board 20. In light of the design of the protruded blocks 44, the resin 46 is prevented from flowing into the grid cells 26 to affect the permeability of the metal layer during the sputtering process.

As shown in FIGS. 6(a), 6(b), 7(a), 7(b), the mold is opened to removed therefrom the semifinished product, which is placed on a worktable to carry out a sputtering procedure to provide the semifinished product with a uniformly-deposited metal layer 50 having a resistance value of about 1.5 OHM. The pins 22 are not sputtered so as to prevent the functional characteristics of the product from being affected.

Upon completion of the sputtering process, the semifinished product is arranged in a second molding tool (not shown in the drawings) for enabling the metal layer 50 to be hermetically enclosed between two resin layers. The second molding tool is similar in construction to the first molding tool, with the difference being that the former is not provided with the protruded blocks which are intended to prevent the waste of the resin.

As shown in FIG. 8, a finished product 60 is removed from the second molding tool in which the circuit board 20 is packaged. In light of the circuit board 20 being provided with the metal passivation layer, the circuit system is stable to prevent erroneous action which may be caused by the signal. The present invention prevents electromagnetic interference and short circuit. In addition, the present invention is efficient and cost-effective.

What is claimed is:

1. A circuit board packaging process comprising the steps of:
   (a) arranging in the lower mold of a first molding tool circuit board with a plurality of pins welded thereto;
   (b) joining the upper mold of the first molding tool with the lower mold, and injecting a resin;
   (c) opening the molding tool to remove therefrom a semifinished product, which is then provided with a metal passivation layer;
   (d) arranging the semifinished product in a second molding tool in which the semifinished product is provided with a second resin coating; and
   (e) opening the second molding tool to remove therefrom a finished product,
   wherein the pins have a front end and two sides and are provided at the front end and two sides with an indentation for anchoring the resin.

2. The process as defined in claim 1, wherein the metal passivation layer of the step(c) is formed by sputtering.

3. A circuit board packaging process comprising the steps of:
   (a) arranging in the lower mold of a first molding tool a circuit board with a plurality of pins welded thereto, each pin having a front end;
   (b) joining the upper mold of the first molding tool with the lower mold, and injecting a resin;
   (c) opening the molding tool to remove therefrom a semifinished product, which is then provided with a metal passivation layer;
   (d) arranging the semifinished product in a second molding tool in which the semifinished product is provided with a second resin coating; and
   (e) opening the second molding tool to remove therefrom a finished product,
   wherein the circuit board is provided with a connection piece which is located at a distance away from the front end of the pins such that the connection piece is serially connected with the pins to enable the pins to be located with precision and to be less vulnerable to severance.

4. The process as defined in claim 3, wherein the pins are welded to the circuit board such that a plurality of grid cells are formed between each pin and the connection piece.

5. The process as defined in claim 4, wherein the first molding tool is provided with a plurality of protruded blocks opposite to the grid cells such that the protruded blocks are extended into the grid cells at the time when the upper mold is joined with the lower mold, so as to prevent the waste of the resin that is injected.

* * * * *